US012685119B2

(12) United States Patent
Ham et al.

(10) Patent No.: US 12,685,119 B2
(45) Date of Patent: Jul. 14, 2026

(54) REVERSED HIGH ASPECT RATIO CONTACT (HARC) STRUCTURE AND PROCESS

(71) Applicant: SAMSUNG ELECTRONICS CO., LTD., Suwon-si (KR)

(72) Inventors: Buhyun Ham, Mechanicville, NY (US); Byounghak Hong, Albany, NY (US); Myunghoon Jung, Clifton Park, NY (US); Wonhyuk Hong, Clifton Park, NY (US); Seungyoung Lee, Clifton Park, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 703 days.

(21) Appl. No.: 17/887,203

(22) Filed: Aug. 12, 2022

(65) Prior Publication Data

US 2023/0326858 A1 Oct. 12, 2023

Related U.S. Application Data

(60) Provisional application No. 63/329,720, filed on Apr. 11, 2022.

(51) Int. Cl.
H01L 23/535 (2006.01)
H01L 21/768 (2006.01)
(Continued)

(52) U.S. Cl.
CPC ...... H01L 23/535 (2013.01); H01L 21/76897 (2013.01); H01L 23/5286 (2013.01);
(Continued)

(58) Field of Classification Search
CPC ... H01L 23/52; H01L 23/522; H01L 23/5226; H01L 23/528–5286;
(Continued)

(56) References Cited

U.S. PATENT DOCUMENTS

| | | | |
|---|---|---|---|
| 6,177,320 B1 | 1/2001 | Cho et al. | |
| 10,475,692 B2 | 11/2019 | Licausi et al. | |

(Continued)

FOREIGN PATENT DOCUMENTS

| | | |
|---|---|---|
| CN | 107993978 B | 8/2020 |
| TW | 202211419 A | 3/2022 |
| WO | 2021/259479 A1 | 12/2021 |

OTHER PUBLICATIONS

Park, Sejun et al., "Highly-Reliable Cell Characteristics with 128-Layer Single-Stack 3D-NAND Flash Memory", 2021 Symposium on VLSI Technology Digest of Technical Papers, 2021. (2 pages total).

(Continued)

*Primary Examiner* — Dale E Page
*Assistant Examiner* — Douglas Yap
(74) *Attorney, Agent, or Firm* — Myers Bigel, P.A.

(57) ABSTRACT

Provided is a semiconductor chip architecture including a wafer, a front-end-of-line (FEOL) layer on a first side of the wafer, the FEOL layer including a semiconductor device and an interlayer dielectric (ILD) structure on the semiconductor device on the first side of the wafer, a shallow trench isolation (STI) structure in the wafer, and the wafer, a middle-of-line (MOL) layer provided on the first FEOL layer, the MOL layer including a contact and a via connected to the contact, an insulating layer on the first side of the wafer and adjacent to the via in a horizontal direction, a power rail penetrating the wafer from a second side of the wafer opposite to the first side, wherein the via extends (Continued)

through the ILD structure, the STI structure, and the wafer in a vertical direction to contact the power rail.

15 Claims, 18 Drawing Sheets

(51) Int. Cl.
*H01L 23/528* (2006.01)
*H01L 23/532* (2006.01)

(52) U.S. Cl.
CPC .. *H01L 23/53209* (2013.01); *H01L 23/53257* (2013.01); *H01L 23/5329* (2013.01)

(58) Field of Classification Search
CPC . H01L 23/498–49844; H01L 23/49827; H01L 23/481; H01L 21/768; H01L 21/76897; H01L 21/76801–76837; H01L 21/76843–76849; H01L 21/74; H01L 21/743; H01L 21/823475; H01L 21/76802–76816; H01L 21/76898; H01L 21/76877–76883; H01L 23/535; H01L 23/3528; H01L 23/5283; H01L 23/53209–53266; H01L 23/52357; H01L 23/53261; H01L 23/5329; H01L 23/53257
See application file for complete search history.

(56) References Cited

U.S. PATENT DOCUMENTS

| | | | |
|---|---|---|---|
| 10,586,765 B2 | 3/2020 | Smith et al. | |
| 11,004,789 B2 | 5/2021 | Doornbos et al. | |
| 2007/0093055 A1 | 4/2007 | Chou et al. | |
| 2021/0343645 A1* | 11/2021 | Peng | H10D 84/0149 |
| 2021/0375722 A1 | 12/2021 | Kim et al. | |
| 2021/0375861 A1 | 12/2021 | Chung et al. | |
| 2022/0020666 A1* | 1/2022 | Van Dal | H10D 30/6211 |
| 2022/0069076 A1* | 3/2022 | Yu | H10D 62/151 |
| 2022/0384345 A1 | 12/2022 | Park et al. | |
| 2023/0032866 A1* | 2/2023 | Wei | H10D 64/251 |
| 2023/0215767 A1* | 7/2023 | Xie | H10D 30/43 |
| | | | 257/329 |

OTHER PUBLICATIONS

Communication dated Aug. 31, 2023, issued by the European Patent Office in counterpart European Application No. 23165072.2.

* cited by examiner 1116          1111

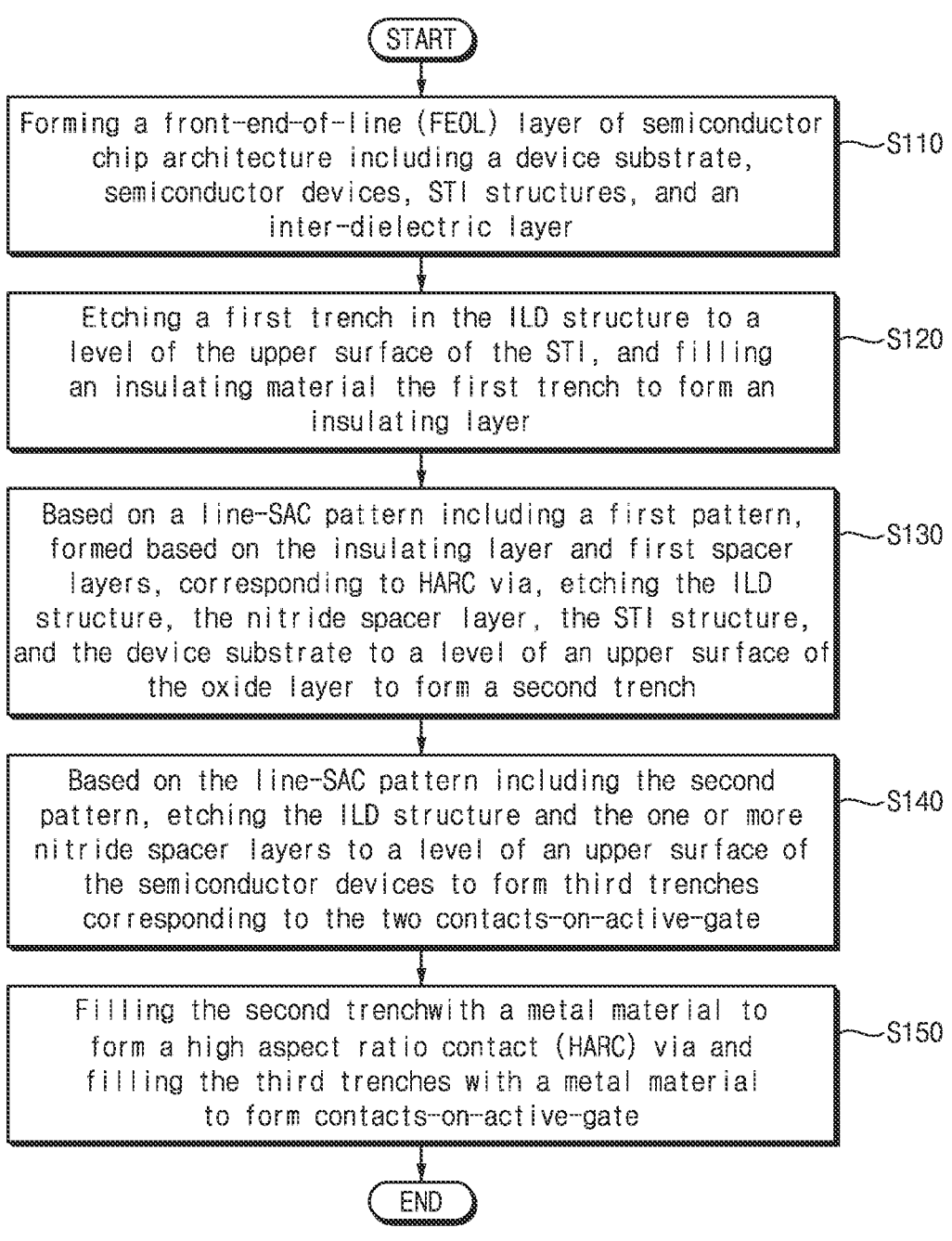

START

Forming a front-end-of-line (FEOL) layer of semiconductor chip architecture including a device substrate, semiconductor devices, STI structures, and an inter-dielectric layer —S110

Etching a first trench in the ILD structure to a level of the upper surface of the STI, and filling an insulating material the first trench to form an insulating layer —S120

Based on a line-SAC pattern including a first pattern, formed based on the insulating layer and first spacer layers, corresponding to HARC via, etching the ILD structure, the nitride spacer layer, the STI structure, and the device substrate to a level of an upper surface of the oxide layer to form a second trench —S130

Based on the line-SAC pattern including the second pattern, etching the ILD structure and the one or more nitride spacer layers to a level of an upper surface of the semiconductor devices to form third trenches corresponding to the two contacts-on-active-gate —S140

Filling the second trenchwith a metal material to form a high aspect ratio contact (HARC) via and filling the third trenches with a metal material to form contacts-on-active-gate —S150

END

FIG. 9

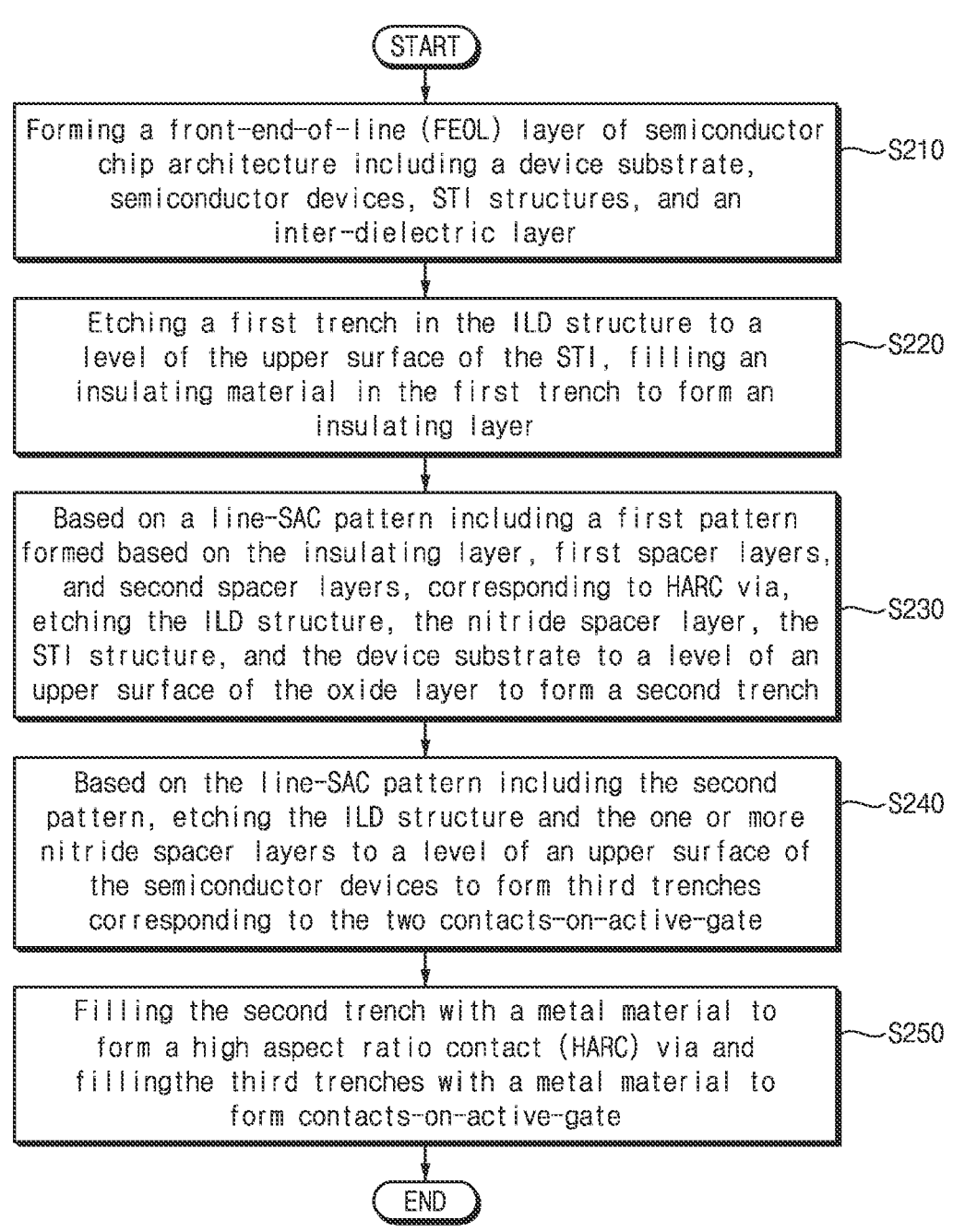

START

Forming a front-end-of-line (FEOL) layer of semiconductor chip architecture including a device substrate, semiconductor devices, STI structures, and an inter-dielectric layer  —S210

Etching a first trench in the ILD structure to a level of the upper surface of the STI, filling an insulating material in the first trench to form an insulating layer  —S220

Based on a line-SAC pattern including a first pattern formed based on the insulating layer, first spacer layers, and second spacer layers, corresponding to HARC via, etching the ILD structure, the nitride spacer layer, the STI structure, and the device substrate to a level of an upper surface of the oxide layer to form a second trench  —S230

Based on the line-SAC pattern including the second pattern, etching the ILD structure and the one or more nitride spacer layers to a level of an upper surface of the semiconductor devices to form third trenches corresponding to the two contacts-on-active-gate  —S240

Filling the second trench with a metal material to form a high aspect ratio contact (HARC) via and fillingthe third trenches with a metal material to form contacts-on-active-gate  —S250

END

FIG. 10

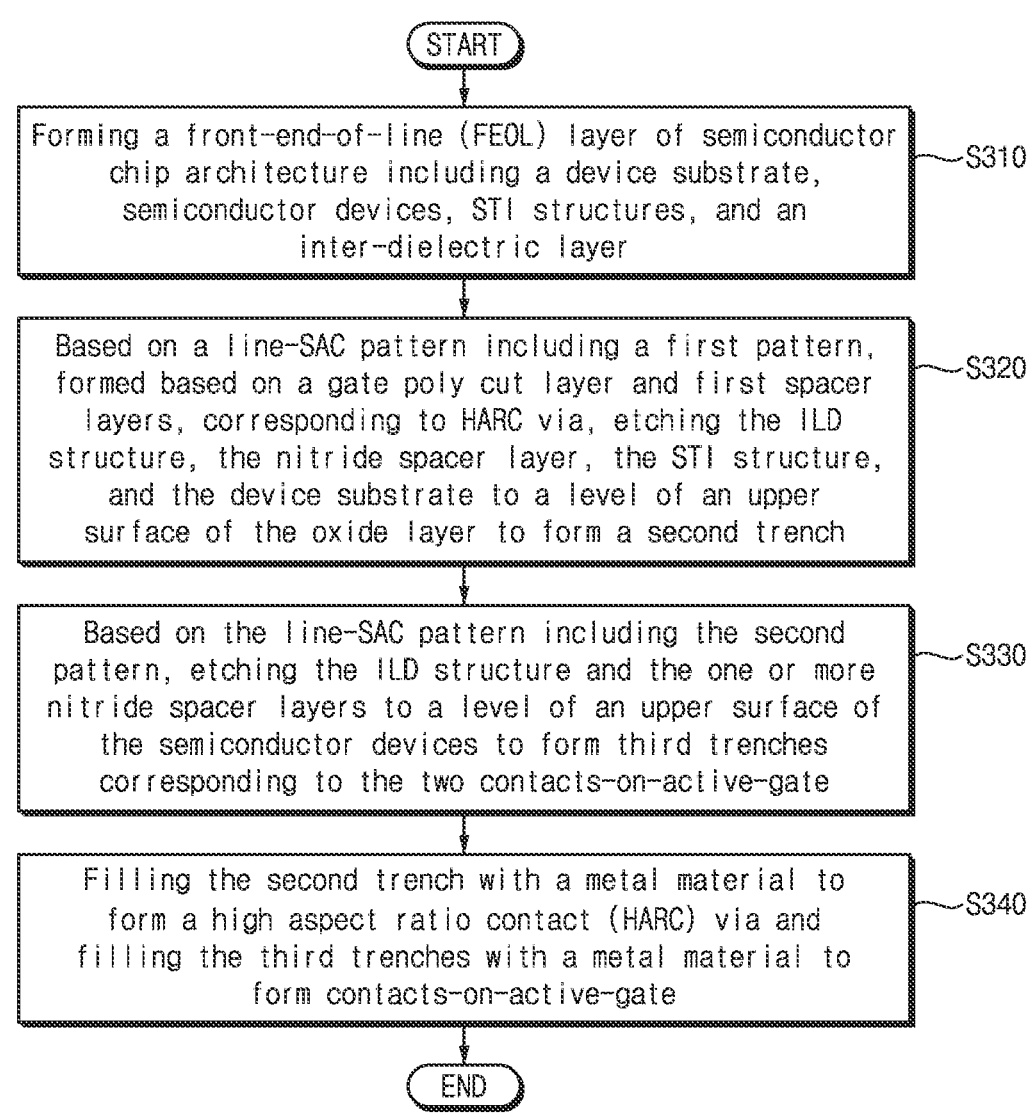

START

Forming a front-end-of-line (FEOL) layer of semiconductor chip architecture including a device substrate, semiconductor devices, STI structures, and an inter-dielectric layer    ~S310

Based on a line-SAC pattern including a first pattern, formed based on a gate poly cut layer and first spacer layers, corresponding to HARC via, etching the ILD structure, the nitride spacer layer, the STI structure, and the device substrate to a level of an upper surface of the oxide layer to form a second trench    ~S320

Based on the line-SAC pattern including the second pattern, etching the ILD structure and the one or more nitride spacer layers to a level of an upper surface of the semiconductor devices to form third trenches corresponding to the two contacts-on-active-gate    ~S330

Filling the second trench with a metal material to form a high aspect ratio contact (HARC) via and filling the third trenches with a metal material to form contacts-on-active-gate    ~S340

END

2000

2100

2300     2200

3000

3100     3400     3200

μ—PROCESSOR     MEMORY

RAM     USER INTERFACE 3300     3300

REVERSED HIGH ASPECT RATIO CONTACT (HARC) STRUCTURE AND PROCESS

CROSS-REFERENCE TO RELATED APPLICATION

This application is based on and claims benefit to U.S. Provisional Application No. 63/329,720 filed on Apr. 11, 2022 in the U.S. Patent and Trademark Office, the disclosure of which is incorporated herein in its entirety by reference.

BACKGROUND

1. Field

Example embodiments of the present disclosure relate to a reversed high aspect ratio contact (HARC) structure included in a semiconductor chip architecture and a method of manufacturing the same.

2. Description of Related Art

As the size of transistors included in a semiconductor chip architecture decreases, a multi-stack semiconductor chip is being developed to vertically stack multiple transistors within a limited area with a compact size. In order to implement a multi-stack semiconductor chip architecture such as, for example, a three-dimensionally (3D) stacked semiconductor chip architecture or a back side power rail semiconductor chip architecture, a high aspect ratio contact (HARC) structure is required. However, in a HARC structure manufacturing process, it may be difficult to align, for example, a HARC via and a contact structure. The resulting misalignment between the HARC via and the contact structure may lead to degradation in the performance of the semiconductor chip architecture.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a reverse high aspect ratio contact (HARC) structure included in a semiconductor chip architecture and a method of manufacturing the same.

According to an aspect of an example embodiment, there is provided a semiconductor chip architecture including a wafer, a front-end-of-line (FEOL) layer on a first side of the wafer, the FEOL layer including a semiconductor device on the first side of the wafer, a shallow trench isolation (STI) structure in the wafer, and an interlayer dielectric (ILD) structure on the semiconductor device and the wafer, a middle-of-line (MOL) layer provided on the first FEOL layer, the MOL layer including a contact and a via connected to the contact, an insulating layer on the first side of the wafer and adjacent to the via in the horizontal direction, a power rail penetrating the wafer from a second side of the wafer opposite to the first side, wherein the via extends through the ILD structure, the STI structure, and the wafer in a vertical direction to contact the power rail.

According to another aspect of an example embodiment, there is provided a semiconductor chip architecture including a wafer, a front-end-of-line (FEOL) layer on a first side of the wafer, the FEOL layer including a semiconductor device on the first side of the wafer, a shallow trench isolation (STI) structure in the wafer, and an ILD structure on the semiconductor device and the wafer, a middle-of-line (MOL) layer provided on the first FEOL layer, the MOL layer including a contact and a via connected to the contact, a gate poly cut pattern on the first side of the wafer and adjacent to the via in a horizontal direction, a power rail penetrating the wafer from a second side of the wafer opposite to the first side, wherein the via extends through the ILD structure, the STI structure, and the wafer in a vertical direction to contact the power rail.

According to another aspect of an example embodiment, there is provided a method of manufacturing a semiconductor chip architecture, the method including forming wafer including an oxide layer, forming a semiconductor device on a first side of the wafer, forming an ILD structure on the semiconductor device and the wafer, patterning the ILD structure based on a self-align contact (SAC) pattern comprising a first pattern and a second pattern, etching the ILD structure and the wafer based on the first pattern to a level of the oxide layer to form a first trench and the ILD structure based on the second pattern to a level of the semiconductor device to form second trenches based on the SAC patterning, filling the first trench and the second trenches with at least one metal material to form a via and contacts, respectively, and forming a power rail penetrating the wafer from a second side of the wafer opposite to the first side such that the power rail contacts the via.

BRIEF DESCRIPTION OF DRAWINGS

The above and/or other aspects, features, and advantages of example embodiments of the disclosure will be more apparent from the following description taken in conjunction with the accompanying drawings, in which:

FIG. 8 illustrates a flowchart of a method of manufacturing a BSPDN semiconductor chip architecture including a HARC via structure according to according to an example embodiment;

FIG. 9 illustrates a flowchart of a method of forming a HARC via structure in a semiconductor chip architecture according to according to another example embodiment;

FIG. 10 illustrates a flowchart of a method of forming a HARC via structure in a semiconductor chip architecture according to according to yet another example embodiment

DETAILED DESCRIPTION

Figure 1:
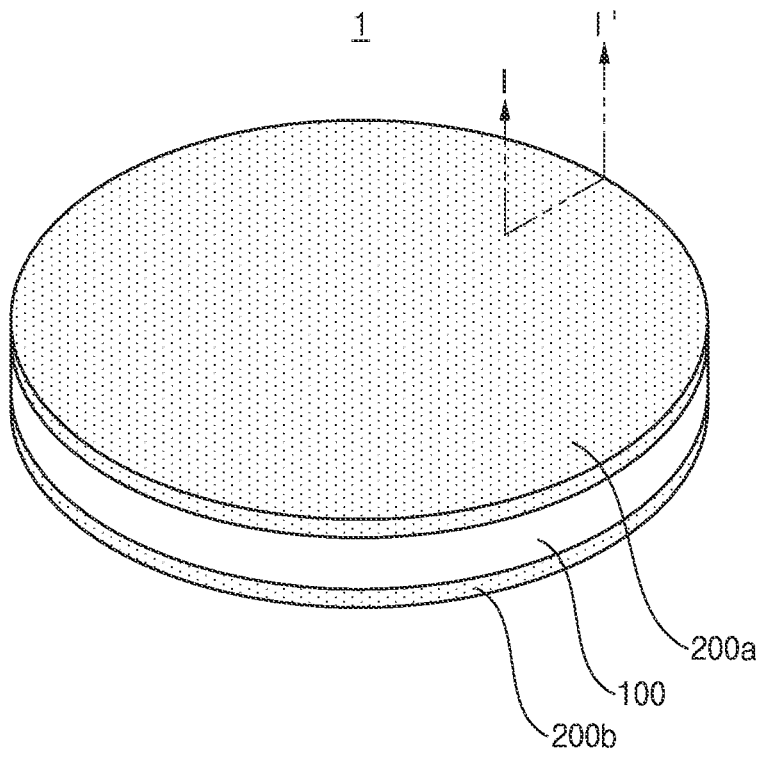
FIG. 1 illustrates a perspective view of a back side power distribution network (BSPDN) semiconductor chip architecture according to an example embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

Hereinafter, embodiments will be explained in detail with reference to the accompanying drawings. Embodiments described herein are example embodiments, and thus, the disclosure is not limited thereto.

FIG. 1 illustrates a perspective view of a back side power distribution network (BSPDN) semiconductor chip architecture according to an example embodiment.

As illustrated in FIG. 1, the BSPDN semiconductor chip architecture 1 may include a wafer 100, a signal wiring layer 200a provided on a first side (front side) of the wafer 100, and a power distribution network (PDN) 200b provided on a second side (back side) of the wafer 100 opposite to the first side.

The wafer 100 may include, for example, a silicon (Si) substrate, a glass substrate, a sapphire substrate, etc. not being limited thereto. As illustrated in FIG. 1, the wafer 100 may be a circular panel, but the shape of the wafer 100 is not limited thereto. For example, the wafer 100 may be a tetragonal panel. The wafer 100 may include a single layer or multiple layers.

The BSPDN semiconductor chip architecture 1 according to the present embodiment may reduce routing congestion and reduce a size of a BSPDN semiconductor chip by removing the PDN from the first side of the wafer 100. Hence a more simplified PDN layer 200*b* may be provided on the second side of the wafer 100.

It is understood that although the signal wiring layer 200*a* and the PDN layer 200*b* are respectively separated by the wafer 100 to have a space therebetween in FIG. 1, at least one of these two layers may be bonded to or otherwise integrated with the wafer 100, or one or more intervening layers may be provided therebetween, according to embodiments.

Figure 2A:
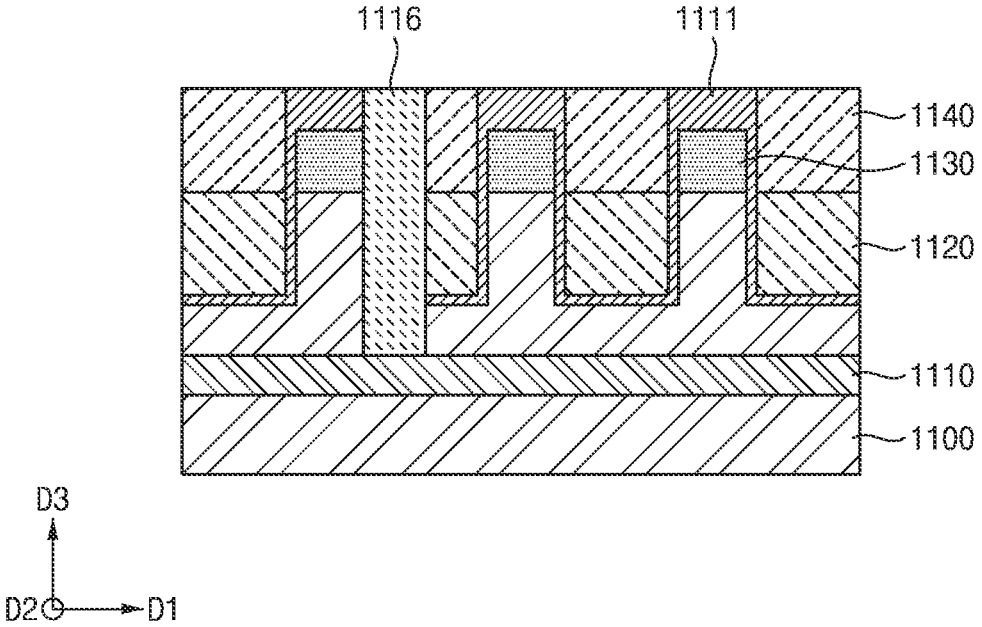
FIGS. 2A, 2B, and 2C illustrates a method of manufacturing a HARC via structure in a semiconductor chip architecture.
Figure 2B:
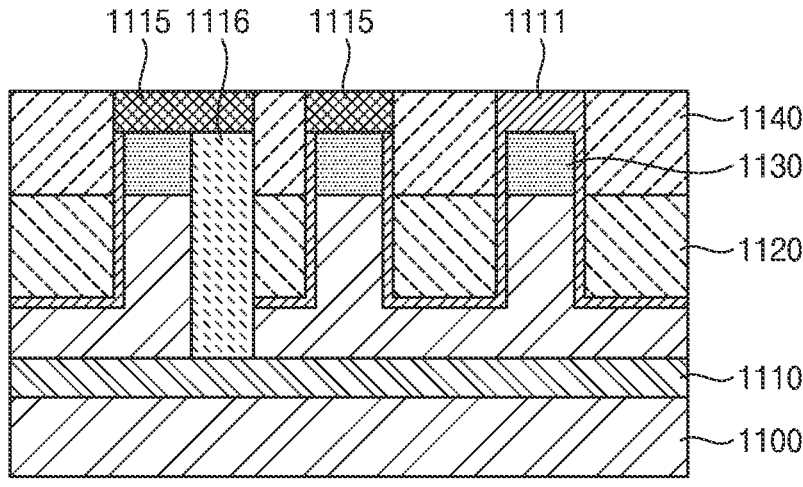

FIGS. 2A and 2B illustrates a method of manufacturing a high aspect ratio contact (HARC) via structure in a semiconductor chip architecture.

Referring to FIG. 2A, the method may include providing a device substrate (wafer) 1100. The device substrate 1100 may be formed of a semiconductor material, for example, silicon (Si), or may be part of a silicon-on-insulator (SOI) substrate, not being limited thereto. The device substrate 1100 may include an oxide layer 1110 including an oxide material.

Shallow trench isolation (STI) structures 1120 may be formed in the device substrate 1100. The STI structures 1120 may extend horizontally in a D2 direction and be spaced apart from each other horizontally in a D1 direction, and may include silicon oxide (SiO) or silicon nitride (SiN), not being limited thereto. Semiconductor devices 1130 may be formed on a first side of the device substrate 1100, and may be isolated from one another by the STI structures 1120 in the D1 direction. The semiconductor devices 1130 may include transistors. Each of the transistors may include an epitaxial layer which may be source/drain regions, fins forming channel structures, and a gate structure, not being limited thereto. The transistors described herebelow may be one or more FinFETs, nanowire transistors, nanosheet transistors, etc.

An interlayer dielectric (ILD) structure 1140 may be formed on the STI structures 1120 and the semiconductor devices 1130. The ILD structure 1140 may be formed on the exposed surfaces of the STI structures 1120 and the semiconductor devices 1130. In addition, a nitride spacer layer 1111 may be formed between the semiconductor devices 1130 and the ILD structure 1140 and between the STI structures 1120 and the device substrate 1100.

As illustrated in FIG. 2A, a first trench may be formed in a vertical direction (negative D3 direction) by etching the ILD structure 1140, the nitride spacer layer 111, the STI structures 1120, and the device substrate 1100 to a level of the oxide layer 1110. The trench may be filled with a metal material such as, for example, tungsten (W) or cobalt (Co) to form the HARC via 1116. The HARC via 1116 may be formed adjacent to the semiconductor device 1130 and vertically extend from a level of a first side (upper surface) of the semiconductor device 1130 or an upper surface of the nitride spacer layer 111 to a level of the oxide layer 1110, for example, an upper surface of the oxide layer 1110.

Referring to FIG. 2B, one or more second trenches may be formed by etching one or more nitride spacer layers 1111 and the HARC via 1116 to a level of the upper surface of the semiconductor device 1130. The trench may be filled with a metal material such as, for example, tungsten (W) or cobalt (Co) to form contacts-on-active-gate 1115.

The contacts-on-active-gate 1115 may directly contact the upper surfaces of one or more semiconductor devices 1130 and the HARC via 1116. A contact-on-active-gate 1115 and the HARC via 1116 may be structures included in a middle-of-line (MOL) layer of the semiconductor chip architecture, not being limited thereto.

Figure 2C:
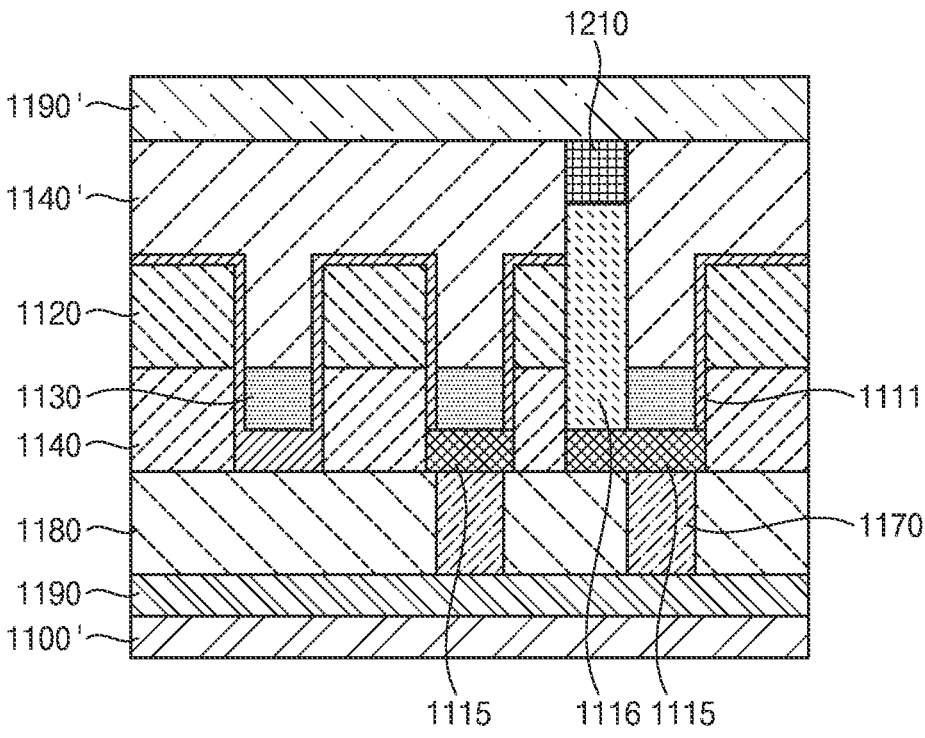

In addition, as illustrated in FIG. 1, referring to FIG. 2C, a back-end-of-line (BEOL) layer including power rails to distribute power may be provided on a second side of the device substrate 1100.

For example, referring to FIG. 2C, the system of FIG. 2B is flipped, and a carrier wafer 1100' may be provided. The carrier wafer 1100' may include Si. A first BEOL layer 1190 may be formed on the carrier wafer 1100'. BEOL contact structures 1170 may be formed on the first BEOL layer 1190, and an ILD structure 1180 may be formed adjacent to the BEOL contact structures 1170 and between the first BEOL layer 1190 and the ILD structure 1140.

The semiconductor chip architecture shown in FIG. 2B may be flipped and attached to the ILD structure 1180 such that the contacts-on-active-gate 1115 contact the ILD structure 1180 and the BEOL vias 1170.

The device substrate 1100 may be etched to the nitride spacer layer 111 to expose the STI structures 1120, the HARC via 1116, and the semiconductor devices 1130. Upper surfaces and side surfaces of the STI structures 1120, an upper surface and a side surface of the HARC via 1116, and upper surfaces of the semiconductor devices 130 may be exposed. Here, the upper surfaces of the STI structures 1120 refer to the bottom surface thereof in FIG. 2B, the upper surface of the HARC via 1116 refers to the bottom surface thereof in FIG. 2B, and the upper surfaces of the semiconductor devices 1130 refer to the bottom surface thereof in FIG. 2B.

Referring to FIG. 2C, an ILD structure 1140' is provided on the STI structures 1120, the HARC via 1116, and the semiconductor devices 1130. The ILD structure 1140' may be patterned and etched to form trenches that expose an upper surface of the HARC via 1116. The trenches may be filled with a metal material to form a back side power rail 1210. The back side power rails 1210 may contact the upper surfaces of the HARC via 1116. The back side power rails 1210 may be, for example, a through-silicon via (TSV) or a buried power rail (BPR). In addition, the back side power rails 1210 may include copper (Cu), Co, W, molybdenum (Mo), and ruthenium (Ru), not being limited thereto. A second BEOL layer 1190' may be provided on the on the ILD structure 1140' and connected to the back side power rail 1210. The semiconductor chip architecture in FIG. 2C may be referred to as a BSPDN semiconductor chip architecture 10 corresponding to a cross sectional view of I-I' in FIG. 1.

The contact-on-active-gate 1115 and HARC via 1116 may connect the semiconductor device 1130 to a buried power rail provided from a second side of the device substrate 1100. The HARC via 1116 may be connected to a buried power rail extending from the second side of the device substrate 1100 through the device substrate 1100.

Referring to FIGS. 2A and 2B, as the trenches for the HARC via 1116 and the contact-on-active-gate 1115 are separately etched based on a hole etch process, it may be difficult to properly align the HARC via 1116 and the contact-on-active-gate 1115 or secure a process margin. In addition, a deep contact surface damage may occur.

Figure 3A:
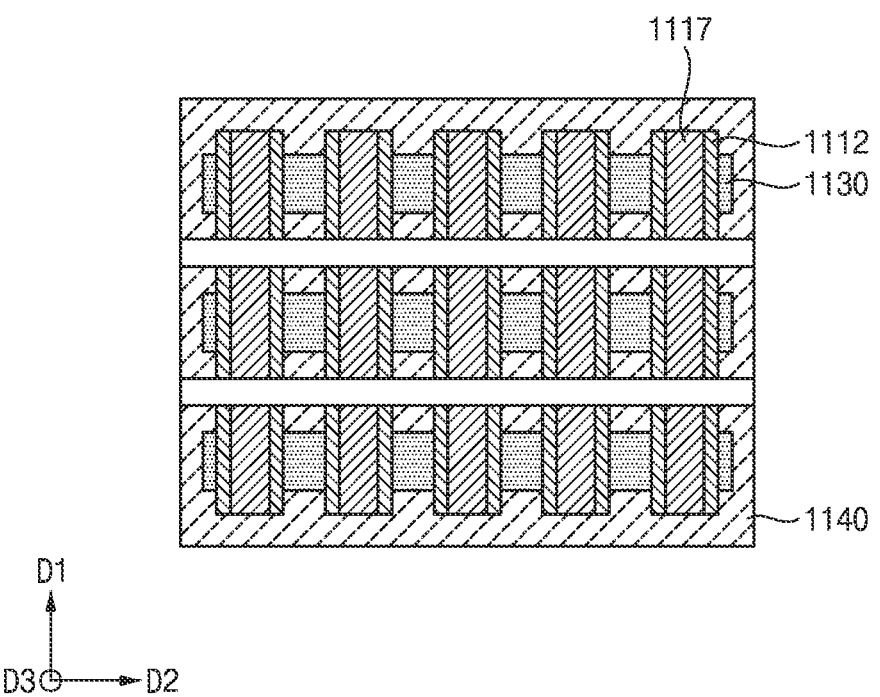
FIG. 3A illustrates plan views of a semiconductor chip architecture.
Figure 3B:
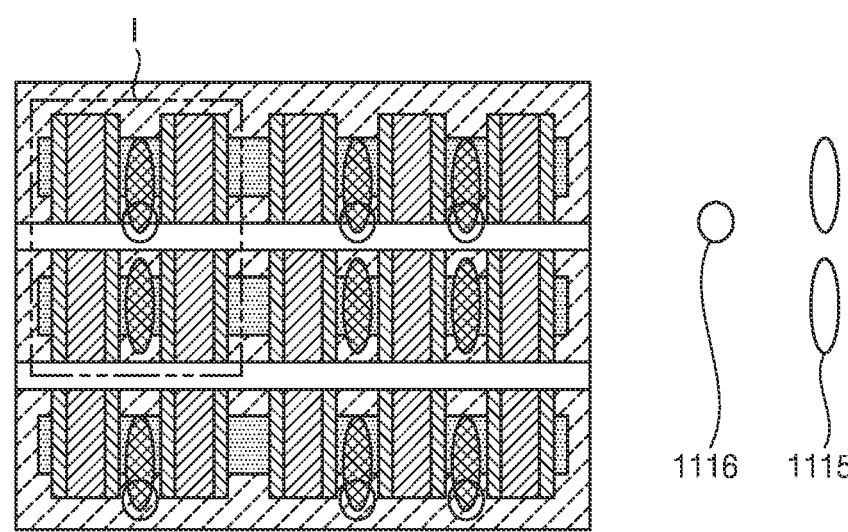
FIG. 3B illustrates a plan view of the semiconductor chip architecture including a HARC via structure in FIG. 2B.

FIG. 3A illustrates plan views of a semiconductor chip architecture, and FIG. 3B illustrates a plan view of the semiconductor chip architecture including a HARC via structure in FIG. 2B.

FIG. 3A illustrates that the semiconductor chip architecture may include the semiconductor device 1130 and the ILD structure 1140. The semiconductor device 1130 may include a gate structure 1117 and spacer layers 1112 provided on side surfaces of the gate structure 1117.

Referring to FIG. 3B, as shown in a portion I in the semiconductor chip architecture, a circular area corresponding to the HARC via 1116 is patterned between spacer layers 1112 of adjacent gate structures 1117 to form the HARC via 1116, and oval areas corresponding to the contacts-on-active-gate 1115 are patterned between spacer layers 1112 of adjacent gate structures 1117 to form the contacts-on-active-gate 1115.

However, due to the width between the spacer layers 1112 of adjacent gate structures 1117 being around 20 nm, it may be difficult to align and etch the oval area corresponding to the contact-on-active-gate 1115 to the circular area corresponding to the HARC via 1116. In addition, a deep contact surface damage may occur in forming the trenches for the via 1116 and the contact-on-active-gate 1115, and the manufacturing costs may increase.

FIGS. 4A, 4B, 4C, 4D, 4E, 4F, 4G, and 4H illustrate a method of manufacturing a BSPDN semiconductor chip architecture including a HARC via structure according to an example embodiment.

Figure 4A:
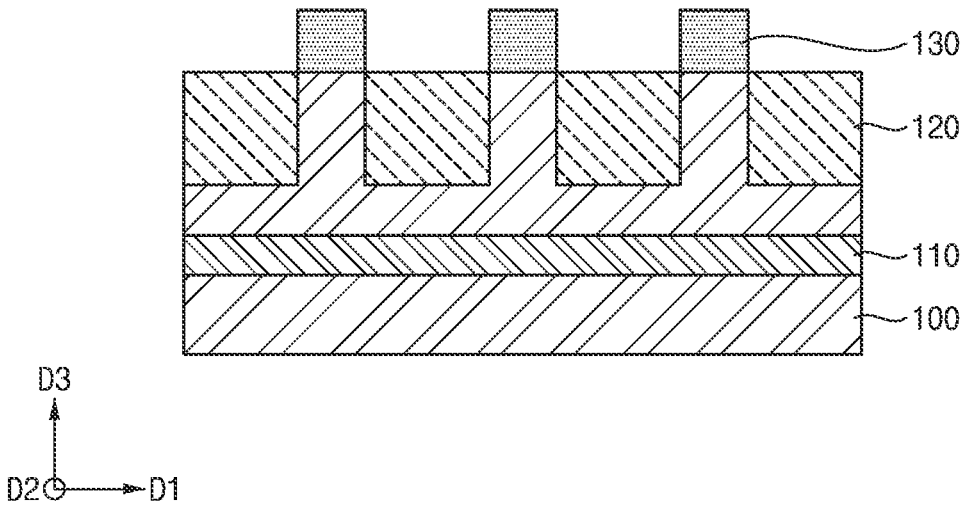
FIGS. 4A, 4B, 4C, 4D, 4E, 4F, 4G, and 4H illustrate a method of manufacturing a BSPDN semiconductor chip architecture including a HARC via structure according to an example embodiment.

Referring to FIG. 4A, the method may include providing a device substrate (wafer) 100. The device substrate 100 may be formed of a semiconductor material, for example, Si, or may be part of a SOI substrate, not being limited thereto. The device substrate 100 may include an oxide layer 110 including an oxide material.

STI structures 120 may be formed in the device substrate 100. The STI structures 120 may extend horizontally in a D2 direction and be spaced apart from each other in a D2 direction, and may include SiO or SiN, not being limited thereto. Semiconductor devices 130 may be formed on a first side of the device substrate 100, and may be isolated from one another by the STI structures 120 in the D1 direction. The semiconductor devices 130 may include transistors. Each of the transistors may include an epitaxial layer which may be source/drain regions, fins forming channel structures, and a gate structure surrounding the fins, not being limited thereto. Herein, the semiconductor device 130 may refer to a front-end-of-line (FEOL) layer including the source/drain regions, fins and the gate structure. The transistors described herebelow may be one or more FinFETs, nanowire transistors, nanosheet transistors, etc.

Figure 4B:
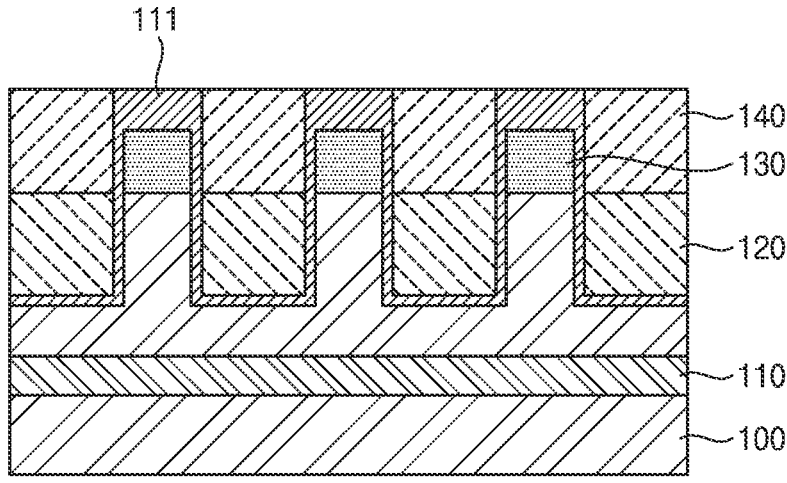

Referring to FIG. 4B, an ILD structure 140 may be formed on the STI structures 120 and the semiconductor devices 130. The ILD structure 140 may be formed on the exposed surfaces of the STI structures 120 and the semiconductor devices 130. In addition, a nitride spacer layer 111 may be formed between the semiconductor devices 130 and the ILD structure 140 and between the STI structures 120 and the device substrate 100.

Figure 4C:
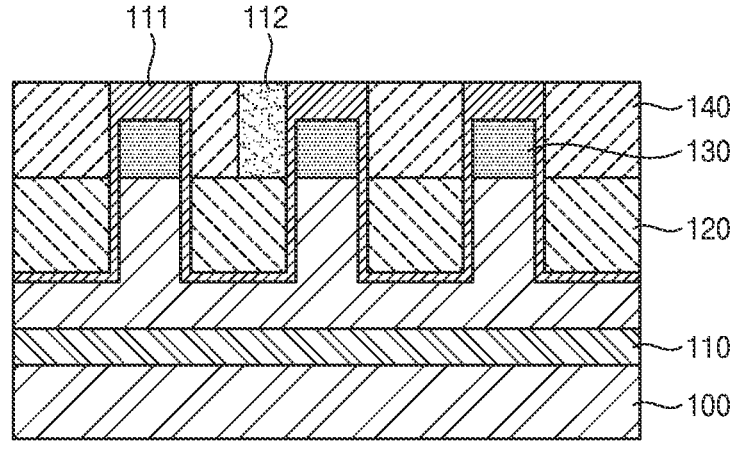

Referring to FIG. 4C, the ILD structure 140 may be etched to form a trench that extends to a level of the upper surface of the device substrate 100 which corresponds to the upper surface of the STI structure 120, and the trench may be filled with a material such as, for example, SiN, silicon carbon-nitride (SiCN), ion-doped carbon, etc., to form an insulating layer 112. The insulating layer 112 may be formed adjacent to a semiconductor device 130 in a horizontal direction.

Figure 4D:
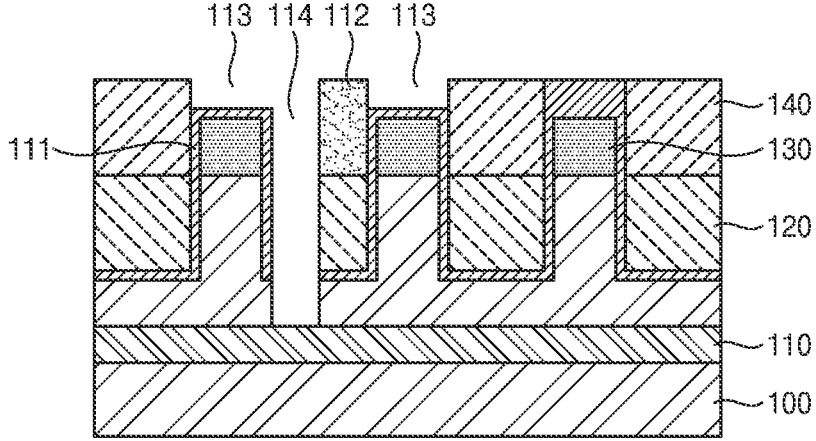

Referring to FIG. 4D, a reverse contact structure pattern is printed as a line-type self-aligned contact (SAC) on the ILD structure 140. The line-SAC pattern includes a first area formed based on the insulating layer 112 and the first spacer layers 123, as described in more detail in FIG. 7A below, corresponding to a HARC via 116 and second areas corresponding to the two contacts-on-active-gate 115. The ILD structure 140 and the device substrate 100 are etched based on the first area to a level of an upper surface of the oxide layer 110 to form a trench 114 corresponding to the HARC via 116. The ILD layer 140 and the one or more nitride spacer layers 111 are etched based on the second areas included in a same pattern to a level of an upper surface of the semiconductor devices 130 to form trenches 113 corresponding to the two contacts-on-active-gate 115 based on the line-SAC pattern. The trenches 114 and 113 may be formed through separate etching processes.

Figure 4E:
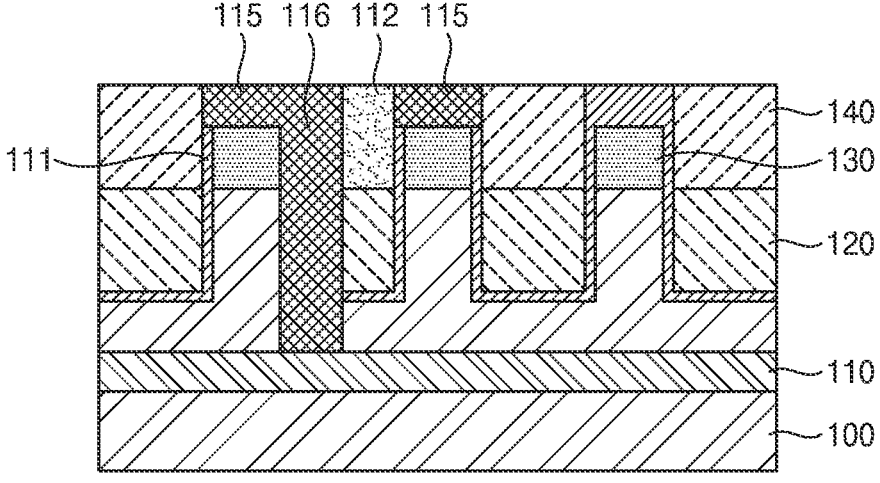

Referring to FIG. 4E, the trenches 114 and 113 may be filled with a metal material such as, for example, W or Co, to form the HARC via 116 and the contacts-on-active-gate 115. The HARC via 116 and a contact-on-active-gate 115 may be integrally formed.

The HARC via 116 and the contact-on-active-gate 115 contact the one or more semiconductor devices 130, and the HARC via 116 extends to a level of the upper surface of the oxide layer in the device substrate 100. The contacts-on-active-gate 115 and the HARC via 116 may be structures included in the middle-of-line (MOL) layer of the semiconductor chip architecture, not being limited thereto.

Figure 4F:
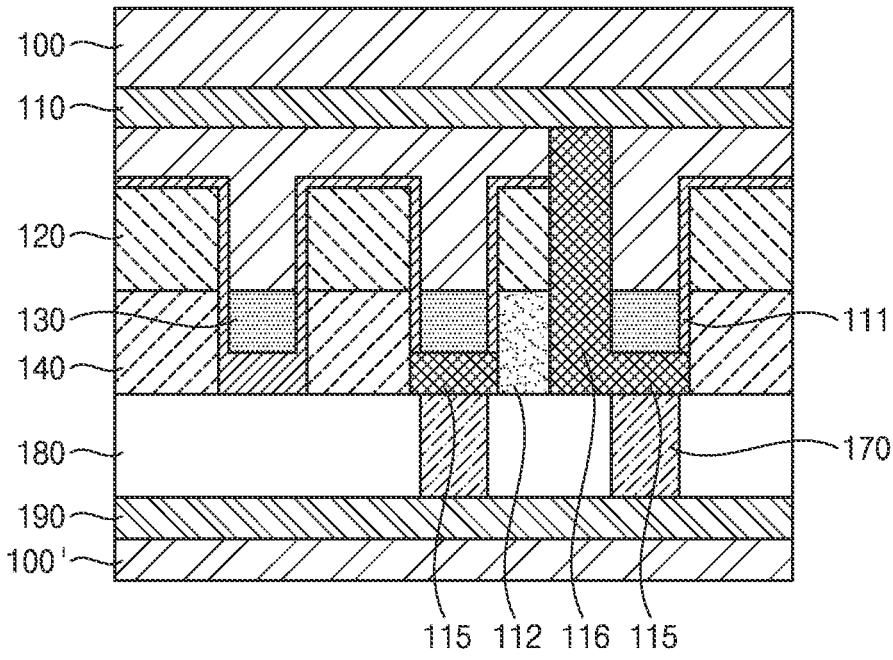

Referring to FIG. 4F, the system of FIG. 4E is flipped, and a carrier wafer 100' may be provided. The carrier wafer 100' may include Si. A first BEOL layer 190 may be formed on the carrier wafer 100'. BEOL contact structures 170 may be formed on the first BEOL layer 190, and an ILD structure 180 may be formed adjacent to the BEOL contact structures 170 and between the first BEOL layer 190 and the ILD structure 140.

The semiconductor chip architecture shown in FIG. 4E may be flipped and attached to the ILD structure 180 such that the contacts-on-active-gate 115 contact the ILD structure 180 and the BEOL vias 170.

Figure 4G:
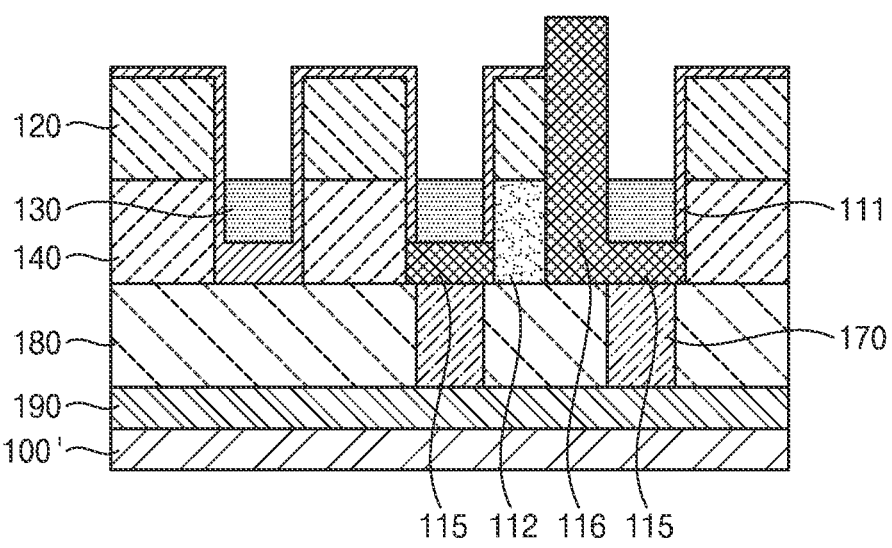

Referring to FIG. 4G, the device substrate 100 may be etched to the nitride spacer layer 111 to expose the STI structures 120, the HARC via 116, and the semiconductor devices 130. Upper surfaces and side surfaces of the STI structures 120, an upper surface and a side surface of the HARC via 116, and upper surfaces of the semiconductor devices 130 may be exposed. Here, the upper surfaces of the STI structures 120 refer to the bottom surface thereof in FIG. 4E, the upper surface of the HARC via 116 refers to the bottom surface thereof in FIG. 4E, and the upper surfaces of the semiconductor devices 130 refer to the bottom surface thereof in FIG. 4E.

Figure 4H:
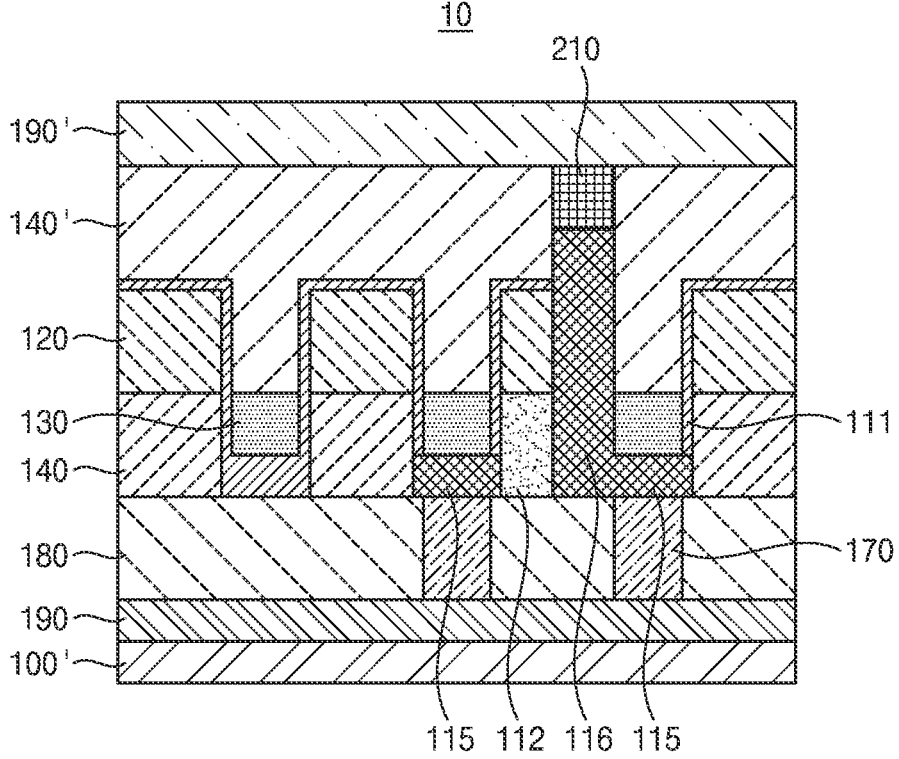

Referring to FIG. 4H, an ILD structure 140' is provided on the STI structures 120, the HARC via 116, and the semiconductor devices 130. The ILD structure 140' may be patterned and etched to form trenches that expose an upper surface of the HARC via 116. The trenches may be filled with a metal material to form a back side power rail 210. The back side power rails 210 may contact the upper surfaces of the HARC via 116. The back side power rails 210 may be, for example, a through-silicon via (TSV) or a buried power rail (BPR). In addition, the back side power rails 210 may include copper (Cu), Co, W, molybdenum (Mo), and ruthenium (Ru), not being limited thereto. A second BEOL layer 190' may be provided on the on the ILD structure 140' and connected to the back side power rail 210. The semiconductor chip architecture in FIG. 4H may be referred to as a BSPDN semiconductor chip architecture 10 corresponding to a cross sectional view of I-I' in FIG. 1.

Figure 5A:
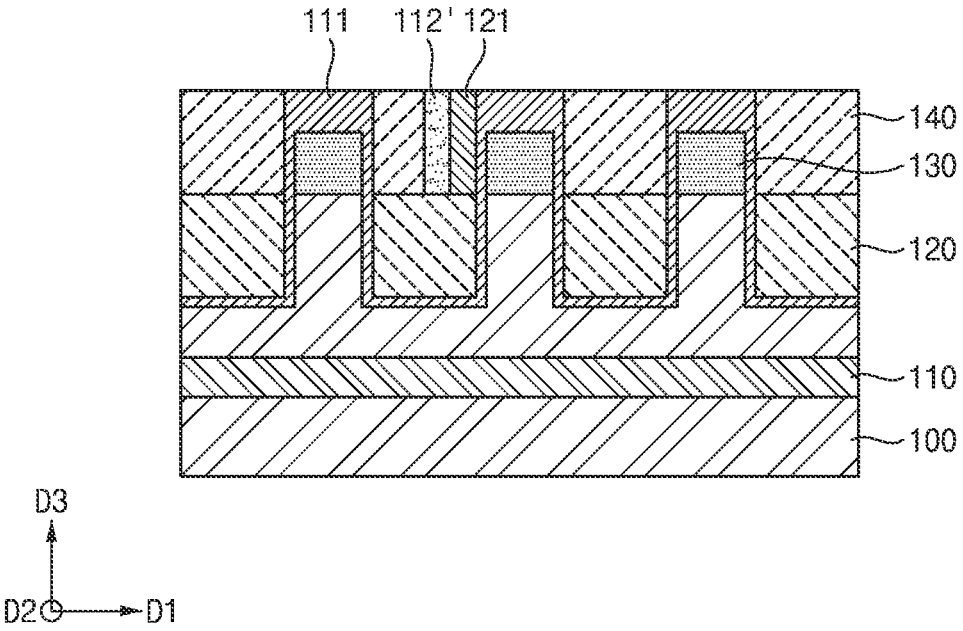
FIGS. 5A, 5B, and 5C illustrate a method of manufacturing a HARC via structure in a semiconductor chip architecture according to another example embodiment.
Figure 5B:
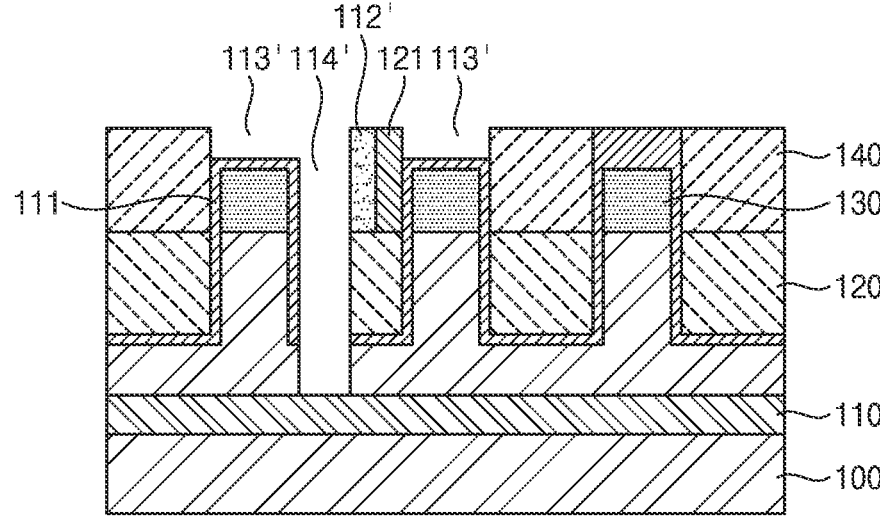
Figure 5C:
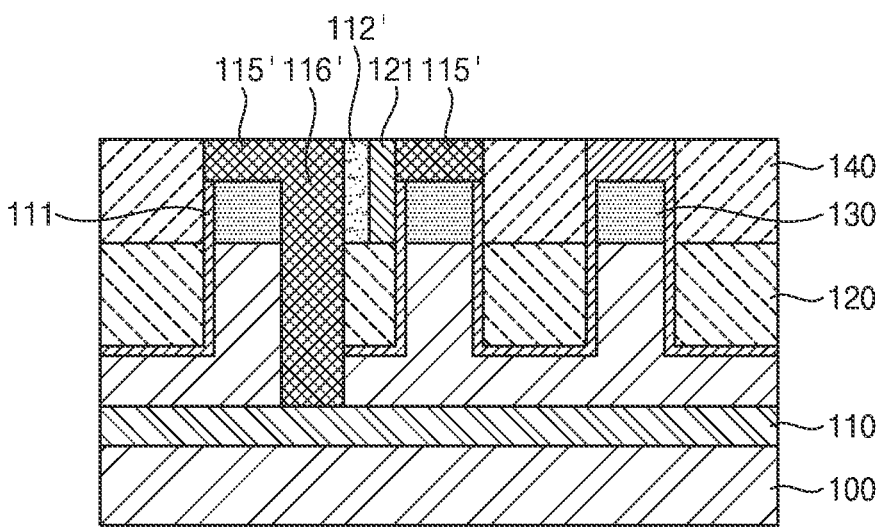

FIGS. 5A, 5B, and 5C illustrate a method of manufacturing a HARC via structure in a semiconductor chip architecture according to another example embodiment;

Referring to FIG. 5A, the ILD structure 140 may be etched based on a second spacer layer 121 to form a trench that extends to a level of the upper surface of the device substrate 100, which corresponds to the upper surface of the STI structures 120, and the trench may be filled with a material such as, for example, SiN, SiCN, ion-doped carbon, etc., to form an insulating layer 112'. The insulating layer 112' may be formed adjacent to a semiconductor device 130.

Referring to FIG. 5B, a reverse contact structure pattern is printed as a line-type self-aligned contact (SAC). The line-SAC pattern includes a first area formed based on the insulating layer 112' and first spacer layers 123, as described in more detail in FIG. 7B below, corresponding to the HARC via 116' and second areas corresponding to the two contacts-on-active-gate 115'. The ILD structure 140 and the device substrate 100 are etched based on the first area to a level of an upper surface of the oxide layer 110 to form a trench 114' corresponding to the HARC via 116' and the ILD layer 140 and the one or more nitride spacer layers 111 are etched based on the second areas to a level of an upper surface of the semiconductor devices 130 to form trenches 113' corresponding to the two contacts-on-active-gate 115' based on the line-SAC pattern. The trench 114' and trenches 113' may be formed through separate etching processes.

Referring to FIG. 5C, the trenches 114' and 113' may be filled with a metal material such as, for example, W or Co, to form the HARC via 116' and the contacts-on-active-gate 115'. The HARC via 116' and a contact-on-active-gate 115' may be integrally formed.

The HARC via 116' and the contact-on-active-gate 115' contact the semiconductor device 130 and the HARC via 116' extends to a level of an upper surface of the oxide layer in the device substrate 100. The contacts-on-active-gate 115' and the HARC via 116' may be structures included in the middle-of-line (MOL) layer of the semiconductor chip architecture, not being limited thereto.

The HARC via 116' and the contacts-on-active-gate 115' may contact the semiconductor device 130 and the HARC via 116' may contact the buried power rail 210 as illustrated in FIG. 4H.

Figure 6A:
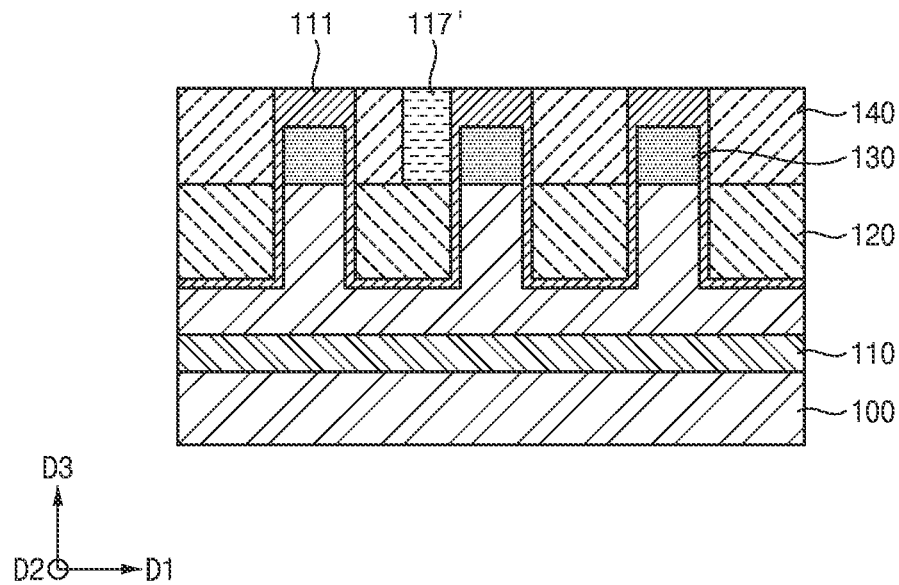
FIGS. 6A, 6B, and 6C illustrate a method of manufacturing a HARC via structure in a semiconductor chip architecture according to another example embodiment.
Figure 6B:
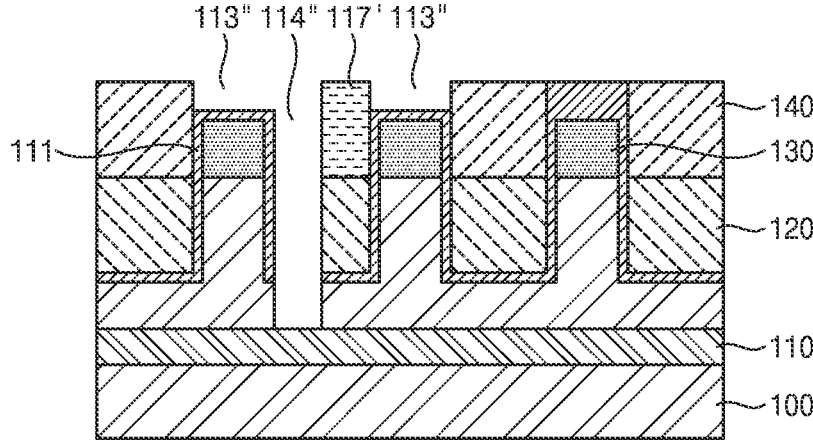
Figure 6C:
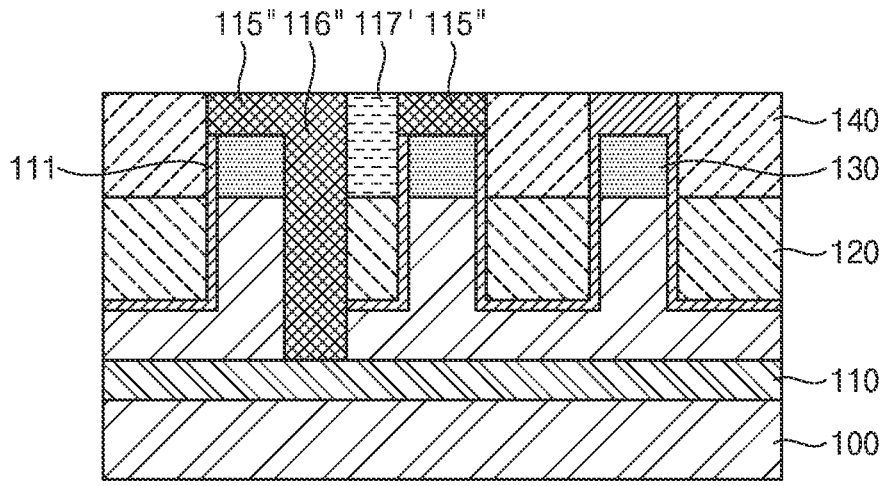

FIGS. 6A, 6B, and 6C illustrate a method of manufacturing a HARC via structure in a semiconductor chip architecture according to another example embodiment;

Referring to FIG. 6A, gate poly cut pattern 117' may be formed adjacent to a semiconductor device 130. As described in more detail in FIG. 7C, the gate poly cut pattern 117' horizontally extends in the D2 direction perpendicular to the D1 direction in which the gate structures 117 and the first spacer layers 123 extend.

The line-SAC pattern is provided on a first area corresponding to the HARC via 116" and second areas corresponding to the two contacts-on-active-gate 115" based on the gate poly cut pattern 117'.

Referring to FIG. 6B, the ILD structure 140 and the device substrate 100 are etched based on the first area formed based on the gate poly cut pattern 117' and the first spacer layers 123 to a level of an upper surface of the oxide layer 110 to form a trench 114" corresponding to the HARC via 116". The ILD layer 140 and the one or more nitride spacer layers 111 are etched based on the second areas to a level of an upper surface of the semiconductor devices 130 to form trenches 113" corresponding to the two contacts-on-active-gate 115" based on the line-SAC pattern. The trench 114" and trenches 113" may be formed through separate etching processes.

Referring to FIG. 6C, the trenches 114" and 113" may be filled with a metal material such as, for example, W or Co, to form the HARC via 116" and the contacts-on-active-gate 115". The HARC via 116" and a contact-on-active-gate 115" may be integrally formed.

The HARC via 116" and the contacts-on-active-gate 115" may contact the semiconductor device 130 and the HARC via 116" may contact the buried power rail 210 as illustrated in FIG. 4F.

Figures 7A, 7B:
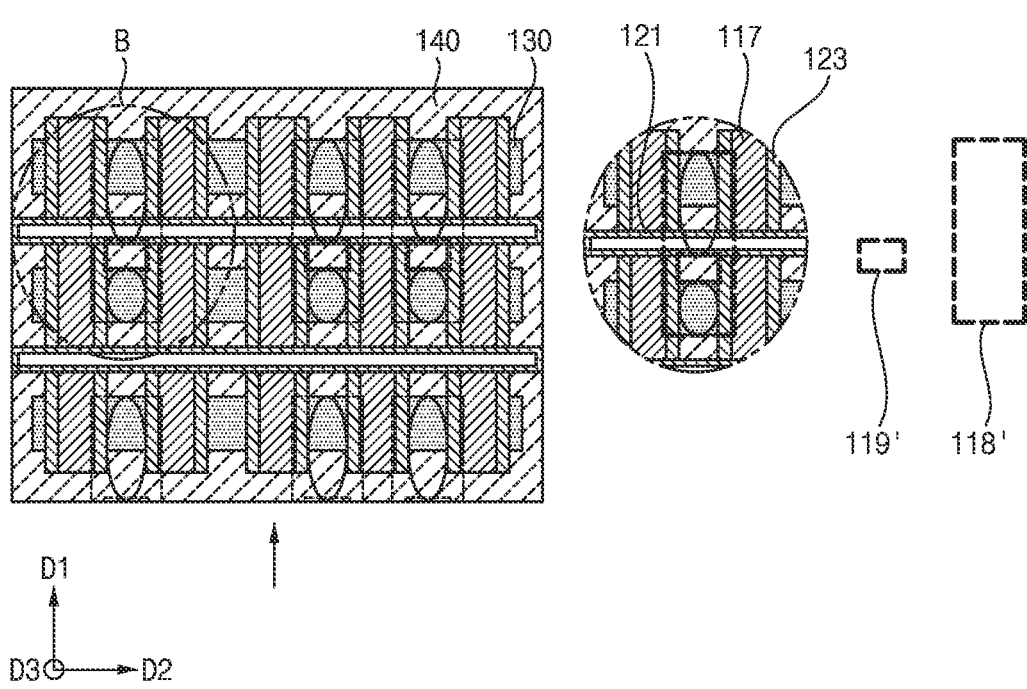
FIG. 7A illustrates a plan view of a self-align contact (SAC) pattern in the semiconductor chip architecture in FIG. 4D.
FIG. 7B illustrates a plan view of a self-align contact (SAC) pattern in the semiconductor chip architecture including a HARC via structure in FIG. 5B.

FIG. 7A illustrates a plan view of a self-align contact (SAC) pattern in the semiconductor chip architecture including a HARC via in FIG. 4E.

Referring to FIG. 7A, the semiconductor chip architecture includes the ILD structure 140 and the semiconductor device 130. The semiconductor device 130 includes a gate structure 117 and first spacer layers 123 provided on side surfaces of the gate structure 117 horizontally extending in the D1 direction.

As shown in a portion A in the semiconductor chip architecture, a first pattern 119 corresponding to the HARC via 116 is patterned and then a second pattern 118 is patterned. The first pattern 119 is patterned based on the first spacer layers 123 and the insulating layer 112. The second pattern 118 is patterned based on an area larger than the area corresponding to the contacts-on-active-gate 115, and includes the first spacer layers 123 provided on side surfaces of the gate structure 117.

Based on the line-SAC pattern including the first pattern 119 corresponding to HARC via 116, the ILD structure 140 and the device substrate 100 are etched to a level of an upper surface of the oxide layer 110 to form a trench 114 corresponding to the HARC via 116. Based on the line-SAC pattern including the second pattern 118, the ILD structure 140 and the one or more nitride spacer layers 111 are etched to a level of an upper surface of the semiconductor devices 130 to form trenches 113 corresponding to the two contacts-on-active-gate 115. The trench 114 and the trenches 113 may be separately etched.

The trenches 114 and 113 may be filled with a metal material to form the HARC via 116 and the contacts-on-active-gate 115.

Accordingly, based on the line-SAC pattern, an alignment between the contact-on-active-gate 115 to the HARC via 116 may improve and a process margin may be secured. In addition, a deep contact surface damage may be avoided.

FIG. 7B illustrates a plan view of a self-align contact (SAC) pattern in the semiconductor chip architecture including a HARC via in FIG. 5C.

Referring to FIG. 7B, the semiconductor chip architecture includes the ILD structure 140 and the semiconductor device 130. The semiconductor device 130 includes a gate structure 117 and first spacer layers 123 provided on side surfaces of the gate structure 117 extending in the D1 direction. In addition, the semiconductor chip architecture includes second spacer layers 121 extending in the D2 direction perpendicular to the gate structures 117 and the first spacer layers 123.

As shown in a portion B in the semiconductor chip architecture, a first pattern 119' corresponding to the HARC via 116 is patterned and then a second pattern 118' is patterned. The first pattern 119' is patterned based on the first spacer layers 123, insulating layer 112' and the second spacer layer 121. The second pattern 118' is patterned based on an area larger than the area corresponding to the contacts-on-active-gate 115', and includes the first spacer layers 123 provided on side surfaces of the gate structure 117.

Based on the line-SAC pattern including the first pattern 119' corresponding to HARC via 116', the ILD structure 140 and the device substrate 100 are etched to a level of an upper surface of the oxide layer 110 to form a trench 114' corresponding to the HARC via 116'. Based line-SAC pattern including the second pattern 118', the ILD structure 140 and the one or more nitride spacer layers 111 are etched to a level of an upper surface of the semiconductor devices 130 to form trenches 113' corresponding to the two contacts-on-active-gate 115'. The trench 114' and the trenches 113' may be separately etched.

The trenches 114' and 113' may be filled with a metal material to form the HARC via 116' and the contacts-on-active-gate 115'.

Accordingly, based on the line-SAC pattern, an alignment between the contact-on-active-gate 115' to the HARC via 116' may improve and a process margin may be secured. In addition, a deep contact surface damage may be avoided.

Figure 7C:
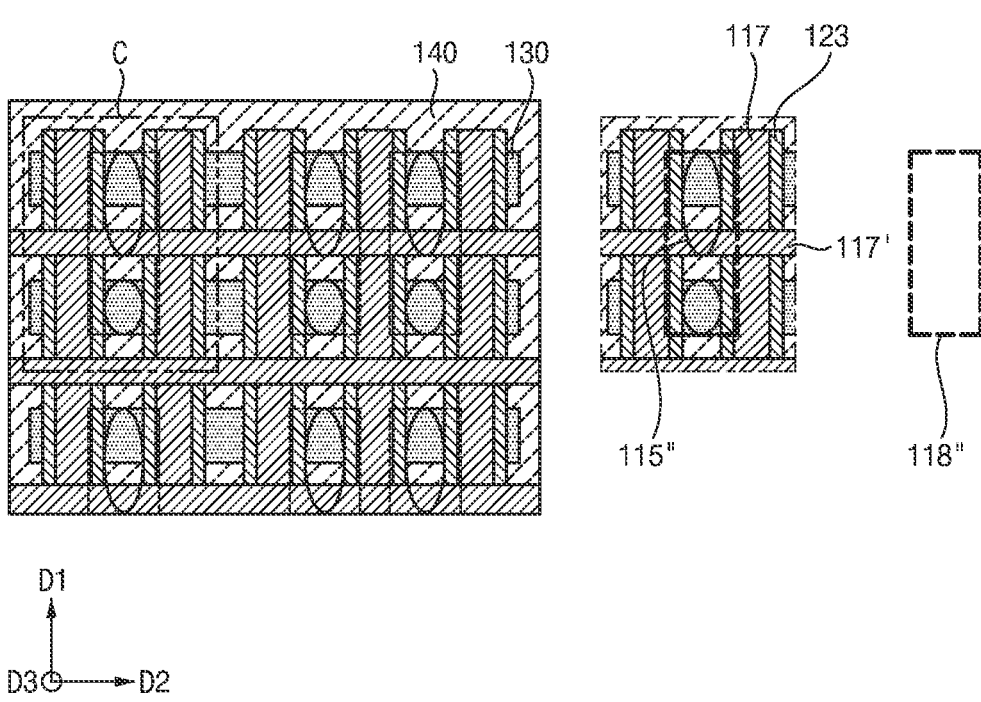
FIG. 7C illustrates a plan view of a self-align contact (SAC) pattern in the semiconductor chip architecture including a HARC via structure in FIG. 6B.

FIG. 7C illustrates a plan view of a self-align contact (SAC) pattern in the semiconductor chip architecture including a HARC via in FIG. 6C.

Referring to FIG. 7C, the semiconductor chip architecture includes the ILD structure 140 and the semiconductor device 130. The semiconductor device 130 includes a gate structure 117 and first spacer layers 123 provided on side surfaces of the gate structure 117. In addition, the semiconductor chip architecture includes gate poly cut pattern 117' horizontally extending in a D1 direction perpendicular to the gate structures 117 and the first spacer layers 123.

As shown in a portion C in the semiconductor chip architecture, a pattern 118" including the first spacer layers 123 is etched to form the HARC via 116" based on the first spacer layers 123 and the gate poly cut pattern 117', and the contacts-on-active-gate 115" based on the line-SAC pattern. The pattern 118" is larger than the area corresponding to the contacts-on-active-gate 115" and HARC via 116", and includes the first spacer layers 123 provided on side surfaces of the gate structure 117.

Based on the gate poly cut pattern 117' and the first spacer layers 123, the ILD structure 140 and the device substrate 100 are etched to a level of an upper surface of the oxide layer 110 to form a trench 114" corresponding to the HARC via 116". Based on the line-SAC pattern including the pattern 118", the ILD structure 140 and the one or more nitride spacer layers 111 are etched to a level of an upper surface of the semiconductor devices 130 to form trenches 113" corresponding to the two contacts-on-active-gate 115". The trench 114" and the trenches 113" may be separately etched.

The trenches 114" and 113" may be filled with a metal material to form the HARC via 116" and the contacts-on-active-gate 115".

Accordingly, an alignment between the contact-on-active-gate 115" to the HARC via 116" may improve and a deep contact surface damage may be avoided. In addition, as a reverse patterning of the area corresponding to the HARC via 116" is not needed in the example embodiment according to FIG. 7C, the manufacturing process may be simplified and the cost may be reduced.

FIG. 8 illustrates a flowchart of a method of a semiconductor chip architecture including a HARC via according to according to an example embodiment.

In operation S110, a front-end-of-line (FEOL) layer of a semiconductor chip architecture is formed. The FEOL layer includes a device substrate that includes an oxide layer, STI structures provided in the device substrate, semiconductor devices provided on an upper surface of the device substrate, and an ILD structure provided on the semiconductor devices and the STI structures.

In operation S120, a first trench is etched in the ILD structure to a level of the upper surface of the STI structure, and an insulating material is filled in the first trench to form an insulating layer.

In operation S130, based on a line-SAC pattern including a first pattern, formed based on the insulating layer and first spacer layers, corresponding to HARC via, the ILD structure, the nitride spacer layer, the STI structure, and the device substrate are etched to a level of an upper surface of the oxide layer to form a second trench.

In operation S140, based on the line-SAC pattern including the second pattern, the ILD structure and the one or more nitride spacer layers are etched to a level of an upper surface of the semiconductor devices to form third trenches corresponding to the two contacts-on-active-gate.

In operation S150, the second trench is filled with a metal material to form a high aspect ratio contact (HARC) via and the third trenches are filled with a metal material to form contacts-on-active-gate.

FIG. 9 illustrates a flowchart of a method of manufacturing a HARC via structure in a semiconductor chip architecture according to another example embodiment.

In operation S210, a front-end-of-line (FEOL) layer of semiconductor chip architecture is formed. The FEOL layer includes a device substrate that includes an oxide layer, STI structures provided in the device substrate, semiconductor devices provided on a first side of the device substrate, and an ILD structure provided on the semiconductor devices and the STI structures.

In operation S220, a first trench is etched in the ILD structure to a level of the upper surface of the STI, and an insulating material is filled in the first trench to form an insulating layer.

In operation S230, based on a line-SAC pattern including a first pattern formed based on the insulating layer, first spacer layers, and second spacer layers, corresponding to HARC via, the ILD structure, the nitride spacer layer, the STI structure, and the device substrate are etched to a level of an upper surface of the oxide layer to form a second trench.

In operation S240, based on the line-SAC pattern including the second pattern, the ILD structure and the one or more nitride spacer layers are etched to a level of an upper surface of the semiconductor devices to form third trenches corresponding to the two contacts-on-active-gate.

In operation S250, the second trench is filled with a metal material to form a high aspect ratio contact (HARC) via and the third trenches are filled with a metal material to form contacts-on-active-gate.

FIG. 10 illustrates a flowchart of a method of a semiconductor chip architecture including a HARC via according to yet another example embodiment In operation S310, a front-end-of-line (FEOL) layer of semiconductor chip architecture is formed. The FEOL layer includes a device substrate that includes an oxide layer, STI structures provided in the device substrate, semiconductor devices provided on a first side of the device substrate, and an ILD structure provided on the semiconductor devices and the STI structures.

In operation 320, a reverse contact structure pattern is printed as a line type self-aligned contact (SAC) on the ILD structure based on the gate poly cut pattern and spacer layers provided on side surfaces of the gate structures.

In operation S330, based on a line-SAC pattern including a first pattern, formed based on a gate poly cut layer and first spacer layers, corresponding to HARC via, the ILD structure, the nitride spacer layer, the STI structure, and the device substrate are etched to a level of an upper surface of the oxide layer to form a second trench.

In operation S340, based on the line-SAC pattern including the second pattern, the ILD structure and the one or more nitride spacer layers are etched to a level of an upper surface of the semiconductor devices to form third trenches corresponding to the two contacts-on-active-gate.

In operation S350, the second trench is filled with a metal material to form a high aspect ratio contact (HARC) via and the third trenches are filled with a metal material to form contacts-on-active-gate.

Figures 11, 12:
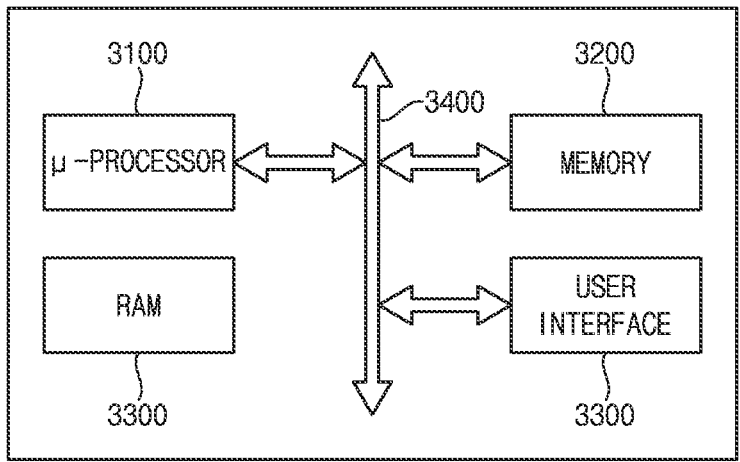
FIG. 11 illustrates a semiconductor architecture that may incorporate the semiconductor chip architecture according to example embodiments.
FIG. 12 illustrates a schematic block diagram of an electronic system according to an example embodiment.

FIG. 11 illustrates a semiconductor architecture that may incorporate the semiconductor chip architecture according to example embodiments.

Referring to FIG. 11, a semiconductor package 2000 according to an embodiment may include a processor 2200 and semiconductor devices 2300 that are mounted on a substrate 2100. The processor 2200 and/or the semiconductor devices 2300 may include one or more of a semiconductor chip architecture described in the above embodiments.

FIG. 12 illustrates a schematic block diagram of an electronic system according to an example embodiment.

Referring to FIG. 12, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include a semiconductor chip architecture as described in the above embodiments.

It should be understood that embodiments described herein should be considered in a descriptive sense only and not for purposes of limitation. Descriptions of features or aspects within each embodiment should typically be considered as available for other similar features or aspects in other embodiments.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor chip architecture comprising:
a first interlayer dielectric (ILD) structure;
a front-end-of-line (FEOL) layer on a first side of the first ILD structure, the FEOL layer comprising a semiconductor device on the first side of the first ILD structure, a shallow trench isolation (STI) structure in the first ILD structure, and a second ILD structure on the semiconductor device and the first ILD structure;
a middle-of-line (MOL) layer provided on the FEOL layer, the MOL layer comprising a contact and a via connected to the contact;
an insulating layer on the first side of the first ILD structure and adjacent to the via in a horizontal direction, a first surface of the insulating layer being coplanar to a first surface of the via; and
a power rail penetrating the first ILD structure from a second side of the first ILD structure opposite to the first side,
wherein the via extends through the second ILD structure, the STI structure, and the first ILD structure in a vertical direction to contact the power rail, a second surface of the via protruding from a second surface of the STI structure,
wherein the semiconductor device comprises gate structures and first spacer layers on side surfaces of the gate structures,
wherein the contact is between adjacent first spacer layers among the first spacer layers and the contact is between side surfaces of adjacent gate structures among the gate structures facing each other in the horizontal direction, and
wherein the gate structure is in direct contact with a second spacer layer that extends in the horizontal direction in a direction perpendicular to the direction in which the first spacer layers extend.

2. The semiconductor chip architecture of claim 1, wherein the via is a high aspect ratio contact (HARC) via that penetrates through the second ILD structure and the first ILD structure in the vertical direction to contact the power rail.

3. The semiconductor chip architecture of claim 1, wherein the insulating layer extends from a level of a first surface of the contact to a first surface of the STI structure in the vertical direction, and directly contacts a side surface of the via in the horizontal direction.

4. The semiconductor chip architecture of claim 1, wherein the via is directly adjacent to the second spacer layer in the horizontal direction.

5. The semiconductor chip architecture of claim 3, wherein the insulating layer comprises one of silicon nitride (SiN), silicon carbon-nitride (SiCN), and ion doped carbon (C).

6. A method of manufacturing a semiconductor chip architecture, the method comprising:
forming a substrate including an oxide layer;
forming a semiconductor device and a shallow trench isolation (STI) structure on a first side of the substrate;
forming a second interlayer dielectric (ILD) structure on the semiconductor device and the substrate;

patterning the second ILD structure based on a self-align contact (SAC) pattern comprising a first pattern and a second pattern;

etching the second ILD structure and the substrate based on the first pattern to a level of the oxide layer to form a first trench and the ILD structure based on the second pattern to a level of the semiconductor device to form second trenches based on the SAC pattern;

filling the first trench and the second trenches with at least one metal material to form a via and contacts, respectively; and flipping the substrate wherein a second side of the substrate that is opposite the first side of the substrate is exposed;

etching the substrate to expose the via and the semiconductor device;

forming a first ILD structure on the semiconductor device and on a side surface of the via, forming a power rail penetrating the first ILD structure from a top side of the first ILD structure such that the power rail contacts the via;

prior to etching the first trench, etching the second ILD structure to a level of the first side of the STI structure to form a third trench; and filling the third trench with an insulating material to form an insulating layer;

wherein the semiconductor device comprises gate structures and first spacer layers on side surfaces of the gate structures, wherein the contact is between adjacent first spacer layers among the first spacer layers and the contact is between side surfaces of adjacent gate structures among the gate structures facing each other in a horizontal direction, and wherein the gate structures are in direct contact with a second spacer layer that extends in the horizontal direction in a direction perpendicular to the direction in which the first spacer layers extend.

7. The method of claim 6, wherein the via is formed adjacent to the insulating layer.

8. The method of claim 7, wherein the second trenches are etched based on the second pattern formed based on the first spacer layers and the first trench.

9. The method of claim 6, wherein the first trench is further etched such that the second spacer layer horizontally extends in a direction perpendicular to a direction in which the first spacer layers extend.

10. The method of claim 6, further comprising:

forming a gate poly cut pattern extending in a direction perpendicular to a direction in which gate structures extend and between gate structures.

11. The method of claim 10, wherein the first trench is etched based on the first pattern formed based on the gate poly cut pattern and first spacer layers directly provided on side surfaces of the gate structures.

12. The method of claim 11, wherein the second trenches are etched based on the second pattern formed based on the first spacer layers and the first trench.

13. The method of claim 11, wherein the via is formed directly adjacent to the gate poly cut pattern.

14. The semiconductor chip architecture of claim 1, wherein the first spacer layers are in contact with the second spacer layer.

15. The method of claim 6, wherein the first spacer layers are in contact with the second spacer layer.

\* \* \* \* \*